United States Patent
Madanipour et al.

(10) Patent No.: US 11,523,544 B2
(45) Date of Patent: Dec. 6, 2022

(54) AIR AND LIQUID COOLING OF ELECTRONIC EQUIPMENT BASED ON A SELECTED HYBRID COOLING PROFILE

(71) Applicant: HEWLETT PACKARD ENTERPRISE DEVELOPMENT LP, Houston, TX (US)

(72) Inventors: Zheila N. Madanipour, Houston, TX (US); William K. Norton, Houston, TX (US); Wade D. Vinson, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 1248 days.

(21) Appl. No.: 15/774,300

(22) PCT Filed: Feb. 16, 2016

(86) PCT No.: PCT/US2016/017988
§ 371 (c)(1),
(2) Date: May 8, 2018

(87) PCT Pub. No.: WO2017/142507
PCT Pub. Date: Aug. 24, 2017

(65) Prior Publication Data
US 2020/0260617 A1    Aug. 13, 2020

(51) Int. Cl.
*G06F 1/20* (2006.01)
*H05K 7/20* (2006.01)

(52) U.S. Cl.
CPC .......... *H05K 7/20836* (2013.01); *G06F 1/20* (2013.01); *H05K 7/20736* (2013.01); *H05K 7/20781* (2013.01)

(58) Field of Classification Search
CPC ..................................................... G06F 1/206
(Continued)

(56) References Cited

U.S. PATENT DOCUMENTS 8,051,897 B2    11/2011  Campbell et al.
10,238,011 B1 *  3/2019  Cui .................... H05K 7/20781
(Continued)

FOREIGN PATENT DOCUMENTS

CN      103676998 A     3/2014
CN      103677180 A     3/2014
(Continued)

OTHER PUBLICATIONS

Electronics Cooling, "Direct Contact Liquid Cooling for the Datacenter—Can it be Simple, Low Cost, High Performance and Efficient?," Dec. 18, 2012, pp. 1-12 (online), ITEM Media, Retrieved from the Internet on 2May 3, 2018 at URL: <electronics-cooling.com/2012/12/direct-contact-liquid-cooling-for-the-datacenter-can-it-be-simple-low-cost-high-performance-and-efficient/>.
(Continued)

*Primary Examiner* — Suresh Suryawanshi
(74) *Attorney, Agent, or Firm* — Hewlett Packard Enterprise

(57) ABSTRACT

In some examples, a controller for air and liquid cooling of electrical equipment is provided. The controller can include a cooling profile assignment module to assign a hybrid cooling profile based on temperature readings of electrical equipment; an air cooling control module to control a forced airflow cooling system for the electrical equipment in accordance with the assigned hybrid cooling profile; and a liquid cooling control module to control a liquid cooling system for the electrical equipment in accordance with the assigned hybrid cooling profile. The assigned hybrid cooling profile can indicate that the forced airflow cooling system is to be used as a primary cooling system for the electrical equipment unless temperature readings indicate that a heat profile of the electrical equipment is above a thermal threshold.

14 Claims, 20 Drawing Sheets

(58) Field of Classification Search
USPC ........................................................ 700/300
See application file for complete search history.

(56) References Cited

U.S. PATENT DOCUMENTS

| | | | |
|---|---|---|---|
| 10,571,980 B2* | 2/2020 | Wang | G06F 1/206 |
| 2010/0032142 A1 | 2/2010 | Copeland et al. | |
| 2011/0197612 A1 | 8/2011 | Campbell et al. | |
| 2012/0136487 A1 | 5/2012 | Lin et al. | |
| 2013/0255932 A1* | 10/2013 | Doepker | F28D 15/00 165/122 |
| 2014/0069111 A1 | 3/2014 | Campbell et al. | |
| 2014/0069626 A1* | 3/2014 | Lin | G06F 1/206 165/287 |
| 2014/0301036 A1 | 10/2014 | Chainer et al. | |
| 2015/0075764 A1 | 3/2015 | Goth et al. | |
| 2017/0231118 A1* | 8/2017 | Cader | H05K 7/20745 |

FOREIGN PATENT DOCUMENTS

| | | |
|---|---|---|
| CN | 103869909 A | 6/2014 |
| CN | 104503556 A | 4/2015 |
| CN | 104699208 A | 6/2015 |
| JP | 2014191783 A | 10/2014 |

OTHER PUBLICATIONS

International Search Report and Written Opinion, International Application No. PCT/US2016/017988, dated Nov. 1, 2016, pp. 1-9, KIPO.

International Preliminary Reporton Patentability received for PCT Patent Application No. PCT/US2016/017988, dated Aug. 30, 2018, 8 pages.

European Search Report and Search Opinion Received for EP Application No. 16890810.1, dated Apr. 4, 2018, 6 pages.

\* cited by examiner

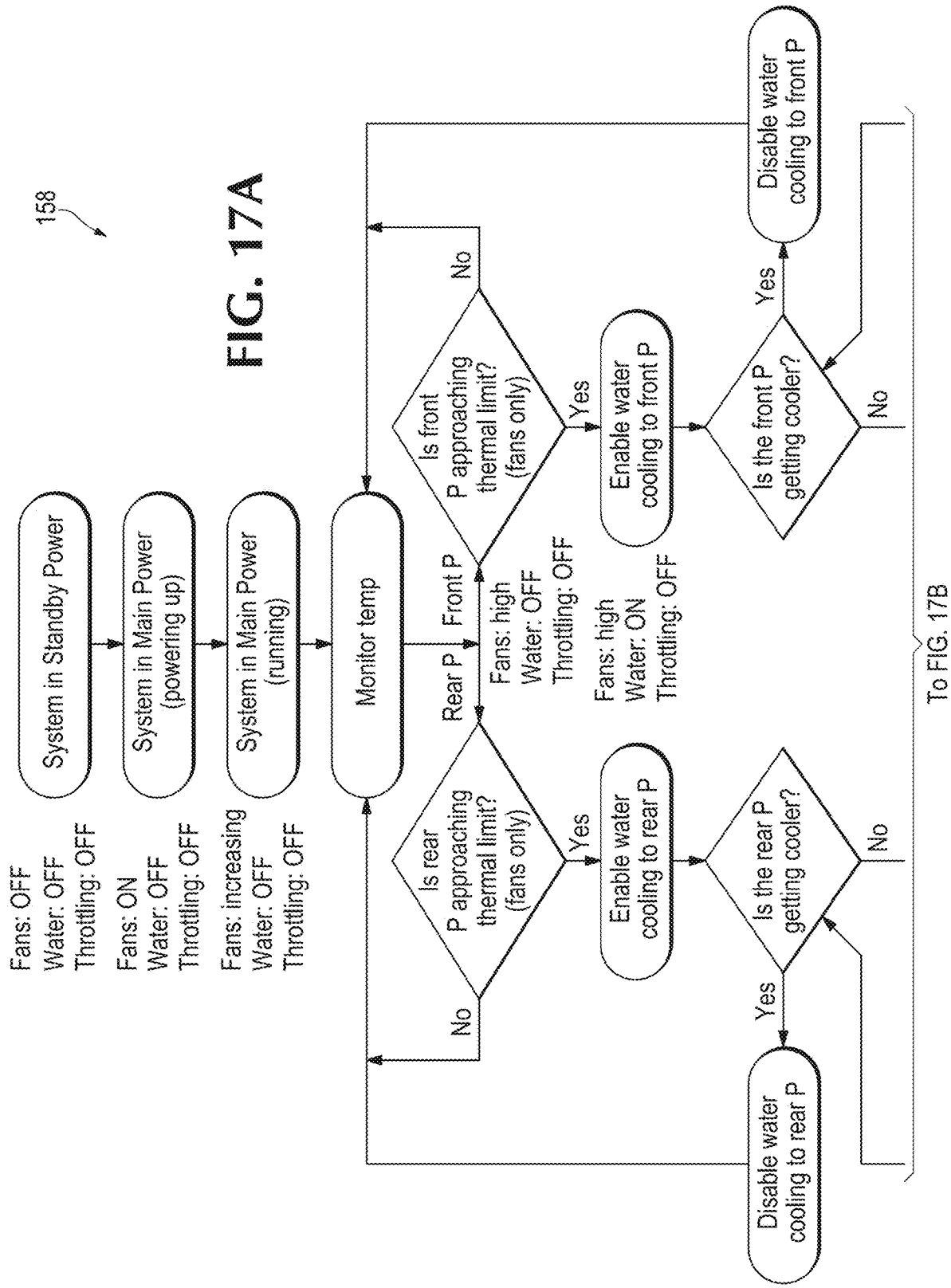

AIR AND LIQUID COOLING OF ELECTRONIC EQUIPMENT BASED ON A SELECTED HYBRID COOLING PROFILE

BACKGROUND

Controlled airflow environments, such as certain data centers, can be designed to house a large number of heat generating equipment, such as computer servers, network switches, and other computing devices. Excessive heat within such an environment can, for example, cause equipment to not perform correctly, corrupt data stored on the equipment, damage the equipment, or cause other issues. In some cases, such environments can rely on one or more systems or techniques to lower the temperature of the equipment, such as certain ambient air cooling systems, forced air cooling systems, liquid cooling systems, processor throttling, etc.

BRIEF DESCRIPTION OF THE DRAWINGS

For a detailed description of various examples, reference will now be made to the accompanying drawings in which:

FIGS. 17a-c together form a flowchart for another example method according to the present disclosure.

DETAILED DESCRIPTION

Figure 1:
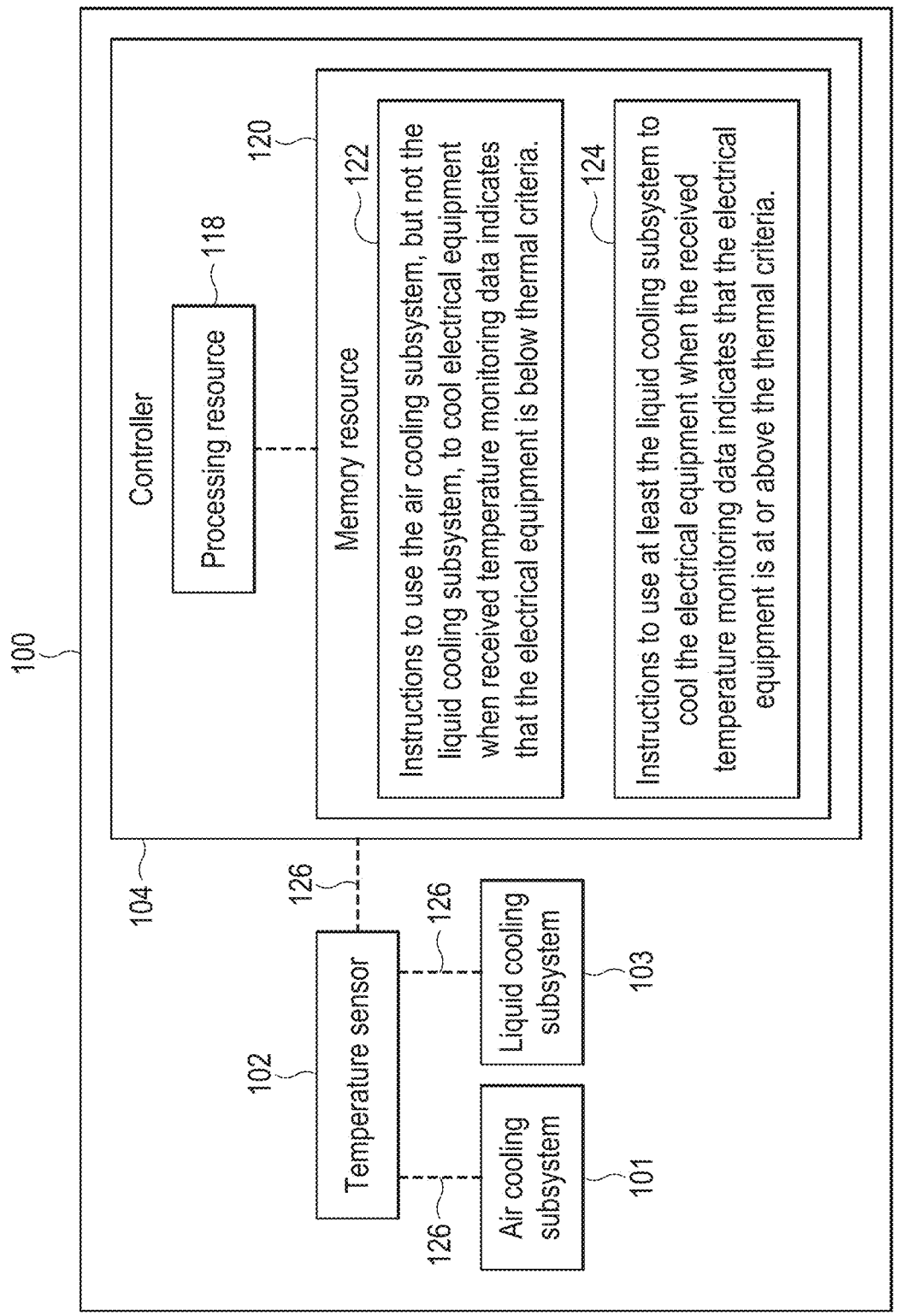
FIG. 1 is a diagram of an example system according to the present disclosure.

The following discussion is directed to various examples of the disclosure. Although one or more of these examples may be preferred, the examples disclosed should not be interpreted, or otherwise used, as limiting the scope of the disclosure, including the claims. In addition, the following description has broad application, and the discussion of any example is meant only to be descriptive of that example, and not intended to suggest or imply that the scope of the disclosure, including the claims, is limited to that example. In the following discussion and in the claims, the terms "including" and "comprising" are used in an open-ended fashion, and thus should be interpreted to mean "including, but not limited to."

As described above, excessive heat within certain controlled airflow environments can cause equipment to not perform correctly, corrupt data stored on the equipment, damage the equipment, or cause other issues. Certain implementations of the present disclosure are directed to improved systems, equipment, techniques, etc., for air and liquid cooling of electrical equipment. For example, in some implementations, such a system can include a temperature sensor to monitor a temperature of electrical equipment and a controller communicatively coupled to the temperature sensor to receive temperature monitoring data from the temperature sensor. This system further includes an air cooling subsystem controlled by the controller to cool the electrical equipment using forced airflow and a liquid cooling subsystem controlled by the controller to cool the electrical equipment using forced liquid flow. The controller includes a processing resource and a memory resource storing machine readable instructions to cause the processing resource to control the air cooling subsystem and the liquid cooling subsystem based on temperature monitoring data received from the temperature sensor. For example, the controller can allow for the use of the air cooling subsystem, but not the liquid cooling subsystem, to cool the electrical equipment when the received temperature monitoring data indicates that the electrical equipment is below thermal criteria and can allow for the use of at least the liquid cooling subsystem when the received temperature monitoring data indicates that the electrical equipment is at or above the thermal criteria.

Certain air and liquid cooling systems in accordance with the present disclosure may provide advantages compared to certain existing cooling solutions. For example, in some implementations, blowout of fans may be delayed or eliminated, which may reduce noise in a data center or other environment. In addition, in some existing cooling systems, if fans are not able to adequately cool the electrical equipment, then certain subsystems may be throttled (e.g., CPU throttling), which can lead to decreased performance until thermal conditions return to suitable levels. Certain implementations of the present disclosure are directed to systems that can reduce the likelihood of such throttling. Moreover, certain implementations of the present disclosure can allow for the use of a reduced size liquid cooling system, which can, for example, result in less chilled water used, smaller circulation pumps, reduced condenser volume, improvements in reliability and longevity, improved system efficiency, etc. Other advantages of implementations presented herein will be apparent upon review of the description and figures.

Figure 2:
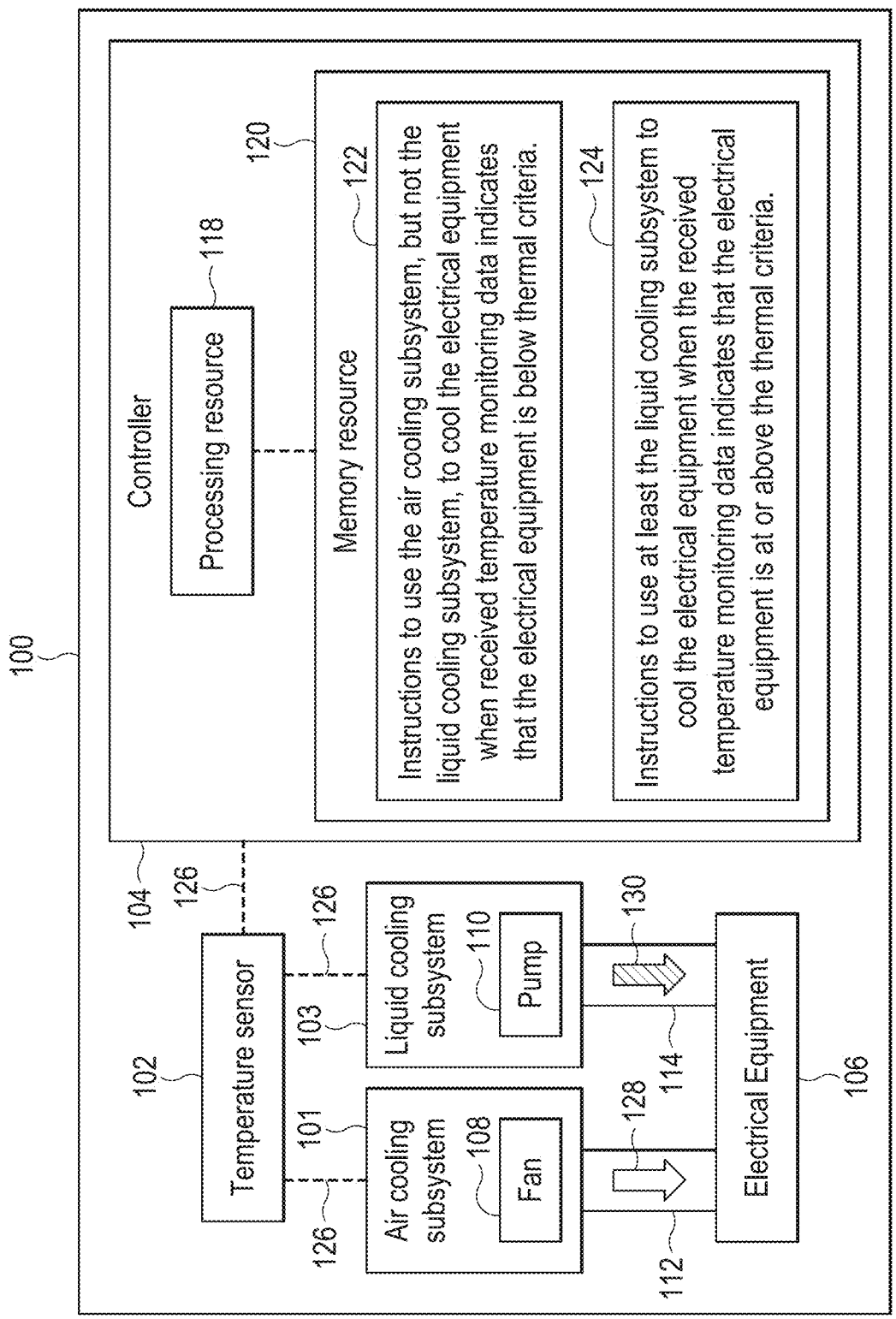
FIG. 2 is a diagram of another example system according to the present disclosure.
Figure 3:
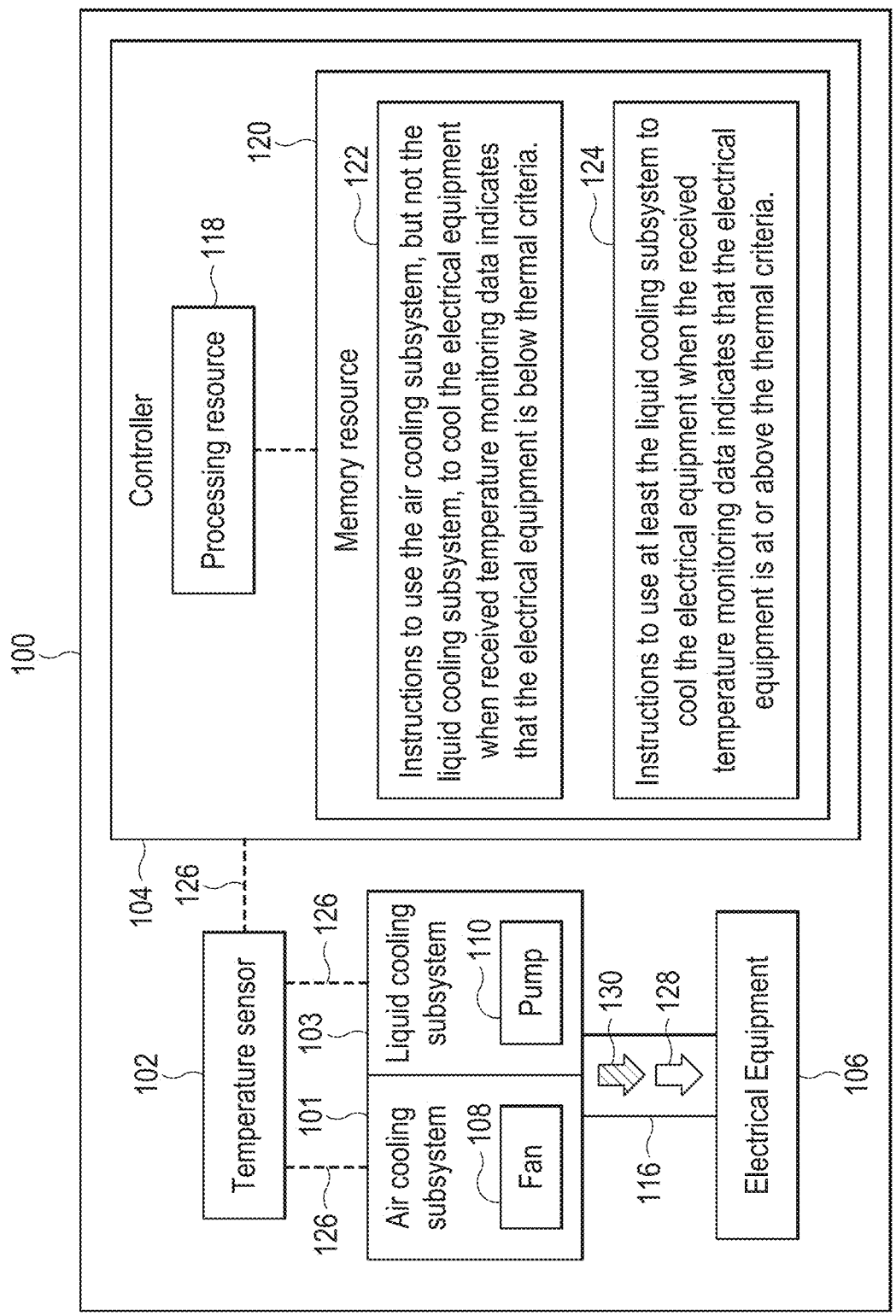
FIG. 3 is a diagram of another example system according to the present disclosure.

FIGS. 1-3 are diagrams of example systems 100 according to the present disclosure. For illustration, various aspects of the system of FIG. 1 are referred to with respect to the system of FIGS. 2-3 (and other FIGs.) and common reference numbers are used between the various figures. It is appreciated that aspects of the system of FIG. 1 can be implemented in the system of FIGS. 2-3 or other implementations described herein and that aspects of other implementations described can be implemented in the system of FIG. 1. Moreover, references to system 100 (or related aspects or implementations) without identification of a specific figure number are understood to refer to any suitable system (or related aspects or implementations) described herein.

In the implementation of FIG. 1, system 100 includes a temperature sensor 102 to monitor a temperature of electrical equipment and a controller 104 communicatively coupled to temperature sensor 102 to receive temperature monitoring data from temperature sensor 102. System 100 further includes an air cooling subsystem 101 controlled by controller 104 to cool the electrical equipment using forced airflow and a liquid cooling subsystem 103 controlled by controller 104 to cool the electrical equipment using forced liquid flow. The implementation of system 100 in FIG. 2 depicts various components not depicted in FIG. 1, such as electrical equipment 106, fan 108, pump 110, an air cooling channel 112, and a liquid cooling channel 114. The implementation of system 100 in FIG. 3 depicts the system of FIG. 2 in which an air cooling channel and a liquid cooling channel are the same channel 116. Each component of system 100 is described in further detail herein.

As provided above, system 100 can, for example, include electrical equipment 106 to be cooled by air cooling subsystem 101 and liquid cooling subsystem 103. Equipment 106 can, for example, be in the form of any suitable equipment that can generate heat. As but one example, equipment 106 can generate heat due to electrical resistance from electrical current. Electrical equipment 106 can, for example, be in the form of a processor, memory, storage device, network switch, I/O controller, network interface card (NICS), Peripheral Component Interconnect (PCI) card, server, power supplies, any suitable heat generating component thereof, etc.

In some implementations, equipment 106 can include an equipment housing to secure equipment 106 within system 100. In some implementations, such housing can, for example, be in the form of a housing made of plastic, metal, or another suitable material and can, in some implementations, include openings for one or more buttons to allow an operator to interact with equipment 106. In implementations where equipment 106 is in the form of a computer server or component thereof, equipment housing can, for example, be in the form of a computer server housing. The housing can, for example, include vents or other airway openings to allow ambient air, forced air, or other cooling mediums, within a room or environment to cool equipment 106.

As provided above, system 100 can, for example, include temperature sensor 102 to monitor a temperature of equipment 106. It is appreciated that any suitable type of temperature sensor 102 may be used with system 100 to measure a temperature of equipment 106. Temperature sensor 102 can, for example, be integrated with equipment 106 or can be a discrete component coupled to equipment 106. As described in further detail below, in some implementations, temperature sensor 102 can be coupled to a processor on equipment 106 to allow equipment 106 to control the operation of a fan (e.g., fan 108) or other cooling system based on readings from temperature sensor 102. In some implementations, temperature sensor 102 can return one or more temperature readings of equipment 106 in response to manual or periodic requests from controller 104, another component of system 100, a request from an operator, etc. In some implementations, temperature sensor 102 can send temperature readings periodically or based on certain rules, such as every 30 seconds or only when the temperature of equipment 106 is above a certain threshold.

As provided above, system 100 can, for example, include controller 104 communicatively coupled to temperature sensor 102 to receive temperature monitoring data from temperature sensor 102. As depicted in the implementation of FIG. 1, controller 104 can include a processing resource 118 and a memory resource 120 storing machine readable instructions 122 and 124 to cause processing resource 118 to control air cooling subsystem 101 and liquid cooling subsystem 103 based on temperature monitoring data received from temperature sensor 102. In some implementations, controller 104 can be implemented in the form of a baseboard management controller (BMC). The BMC can, for example, make a decision to activate cooling based on parameters, such as temperature readings for equipment 106. In some implementations, controller 104 can be in the form of an enclosure manager that can control cooling systems for the whole enclosure, and can instruct specific components, such as each tray of system 100, to achieve an overall cooling profile.

As provided above, memory resource 120 can, for example, store instructions 122 and 124 to cause processing resource 118 to control air cooling subsystem 101 and liquid cooling subsystem 103 based on temperature monitoring data received from temperature sensor 102.

In some implementations, instructions 122 are to cause processing resource 118 to use air cooling subsystem 101, but not liquid cooling subsystem 103, to cool equipment 106 when the received temperature monitoring data indicates that equipment 106 is below the thermal criteria. The terms "below thermal criteria" and "below the thermal criteria" can, for example, refer to a situation in which a monitored temperature of equipment 106 is below a predetermined temperature value. For example, if a predetermined temperature value is 90 degrees Celsius, and a monitored temperature of equipment is 85 degrees Celsius, the received temperature monitoring data may be said to indicate that equipment 106 is below the thermal criteria. It is appreciated that the determination of whether equipment 106 is below the thermal criteria may be more advanced than a comparison of a measured temperature value to a single predetermined temperature value. For example, in some implementations, controller 104 can determine that the received temperature monitoring data indicates that equipment 106 is below the thermal criteria when an average monitored temperature of equipment 106 for a period of time is below a predetermined temperature value. Likewise, in some implementations, controller 104 can determine that the received temperature monitoring data indicates that equipment 106 is below the thermal criteria when a percentage of temperature readings over a period of time is below one or more predetermined temperature values. It is appreciated that any suitable thermal criteria for determining whether equipment should be cooled by air cooling, liquid cooling, or throttling, may be used in accordance with certain implementations of the present disclosure. Further structural and operational details regarding air cooling subsystem 101 are provided below.

In some implementations, instructions 124 are to cause processing resource 118 to use at least liquid cooling subsystem 103 to cool equipment 106 when the received temperature monitoring data indicates that electrical equipment 106 is at or above the thermal criteria. By so waiting to use liquid cooling subsystem 103, liquid cooling subsystem 103, can in some implementations only be activated under heavy use or emergency situations. This can reduce operational costs and provide other advantages over systems in which liquid cooling is a primary cooling solution. In certain implementations, instructions 124 may cause controller 104 to operate both liquid cooling subsystem 103 and air cooling subsystem 101 at the same time (e.g., in parallel or serially) to cool equipment 106. Likewise, in certain implementations, instructions 124 may cause controller 104 to operate liquid cooling subsystem 103 but not air cooling subsystem 101 to cool equipment 106. Further structural and operational details regarding liquid cooling subsystem 103 are provided below.

Processing resource 118 of system 100 can, for example, be in the form of a central processing unit (CPU), a semiconductor-based microprocessor, a digital signal processor (DSP) such as a digital image processing unit, other hardware devices or processing elements suitable to retrieve and execute instructions stored in memory resource 120, or suitable combinations thereof. Processing resource 118 can, for example, include single or multiple cores on a chip, multiple cores across multiple chips, multiple cores across multiple devices, or suitable combinations thereof. Processing resource 118 can be functional to fetch, decode, and execute instructions as described herein. As an alternative or in addition to retrieving and executing instructions, processing resource 118 can, for example, include at least one integrated circuit (IC), other control logic, other electronic circuits, or suitable combination thereof that include a number of electronic components for performing the functionality of instructions stored on memory resource 120. The term "logic" can, in some implementations, be an alternative or additional processing resource to perform a particular action and/or function, etc., described herein, which includes hardware, e.g., various forms of transistor logic, application specific integrated circuits (ASICs), etc., as opposed to machine executable instructions, e.g., software, firmware, etc., stored in memory and executable by a processor. Processing resource 118 can, for example, be implemented across multiple processing units and instructions may be implemented by different processing units in different areas of system 100.

Memory resource 120 of system 100 can, for example, be in the form of a non-transitory machine-readable storage medium, such as a suitable electronic, magnetic, optical, or other physical storage apparatus to contain or store information such as machine-readable instructions 122 and 124. Such instructions can be operative to perform one or more functions described herein, such as those described herein with respect to the methods of FIGS. 16a-b and FIGS. 17a-c or other methods, techniques, or implementations described herein. Memory resource 120 can, for example, be housed within the same housing as processing resource 118 for system 100, such as within a server rack (in implementations where system 100 is housed within a server rack). In some implementations, memory resource 120 and processing resource 118 are housed in different housings. As used herein, the term "machine-readable storage medium" can, for example, include Random Access Memory (RAM), flash memory, a storage drive (e.g., a hard disk), any type of storage disc (e.g., a Compact Disc Read Only Memory (CD-ROM), any other type of compact disc, a DVD, etc.), and the like, or a combination thereof. In some implementations, memory resource 120 can correspond to a memory including a main memory, such as a Random Access Memory (RAM), where software may reside during runtime, and a secondary memory. The secondary memory can, for example, include a nonvolatile memory where a copy of machine-readable instructions are stored. It is appreciated that both machine-readable instructions as well as related data can be stored on memory mediums and that multiple mediums can be treated as a single medium for purposes of description.

Memory resource 120 can be in communication with processing resource 118 via a communication link 126. Each communication link 126 can be local or remote to a machine (e.g., a computing device) associated with processing resource 118. Examples of a local communication link 126 can include an electronic bus internal to a machine (e.g., a computing device) where memory resource 120 is one of volatile, non-volatile, fixed, and/or removable storage medium in communication with processing resource 118 via the electronic bus.

As provided above, system 100 can, for example, include an air cooling subsystem 101 controlled by controller 104 to cool equipment 106 using forced airflow. In some implementations, air cooling subsystem 101 includes a fan 108 (see, e.g., FIG. 2) to cool equipment 106. Fan 108 can, for example, be used to flow air 128 (see, e.g., FIG. 2) through a channel (e.g., channel 112 in FIG. 2, channel 116 in FIG. 3, etc.), which can, for example be in the form of ductwork or another suitable air channel. As used herein, the term "flow" in the context of flowing air or liquid can, for example refer to any suitable forcing, directing, moving, pushing, or other similar actions performed on air or liquid. Fan 108 can, for example, be connected to controller 104 to allow controller 104 to control operation of fan 108. Fan 108 can, for example, be connected to controller 104 via a wired or wireless connection that allows signals relating to operation of fan 108 to be communicated. In some implementations, fan 108 can be positioned at any suitable location within the various channels or system 100 to flow air 128 to cool equipment 106. In some implementations, multiple fans 108 are used in air cooling subsystem 101. For example, a first fan 108 can be located upstream of equipment 106 and a second fan 108 can be located downstream of equipment 106.

As provided above, system 100 can, for example, include a liquid cooling subsystem 103 controlled by controller 104 to cool equipment 106 using forced liquid flow. The liquid used by liquid cooling subsystem 103 can be water (e.g., distilled water) or other suitable liquid, such as certain liquid coolants commonly used in liquid cooling systems. Liquid cooling subsystem 103 can be used to cool any suitable component of equipment 106, such as a Central Processing Unit (CPU) or other component. Liquid cooling subsystem 103 can, for example, include a fluid block, a fluid pump 110 (see, e.g., FIG. 2), and a fluid-to-air heat exchanger. Pump 110 can, for example, be used to circulate liquid 130 (see, e.g., FIG. 2) to cool equipment 106. Pump 110 can flow liquid 130 through a channel (e.g., channel 114 of FIG. 2, channel 116 of FIG. 3, etc.) which can, for example be in the form of suitable ductwork or another suitable fluid channel.

As provided above, in some implementations, system 100 can include one or more air cooling channels (e.g., 112, 116) through which air is passed from air cooling subsystem 101 to cool equipment 106. Such channels can be an enclosed channel (e.g., ductwork) or may not be enclosed (e.g., the space between a fan blowing on equipment may be referred to as a "channel" for purposes of the present disclosure). Likewise, in some implementations, system 100 can include one or more liquid cooling channels (e.g., 114, 116) through which liquid 130 is passed from liquid cooling subsystem 103 to cool equipment 106. In some implementations, air cooling channel 112 is a distinct channel from liquid cooling channel 114 (see, e.g., FIG. 2), whereas in other implementations, the air cooling channel is the same channel 116 as the liquid cooling channel. Various examples of channel configurations are provided below with respect to FIGS. 1-3. Such channels may be made of a suitably rigid or flexible material based on desired cooling characteristics of system 100. Although such channels are depicted in the figures as extending in a single direction, it is appreciated that certain implementations can include non-straight channels, such as channels with one or more curves, bends, or corners.

Figure 4:
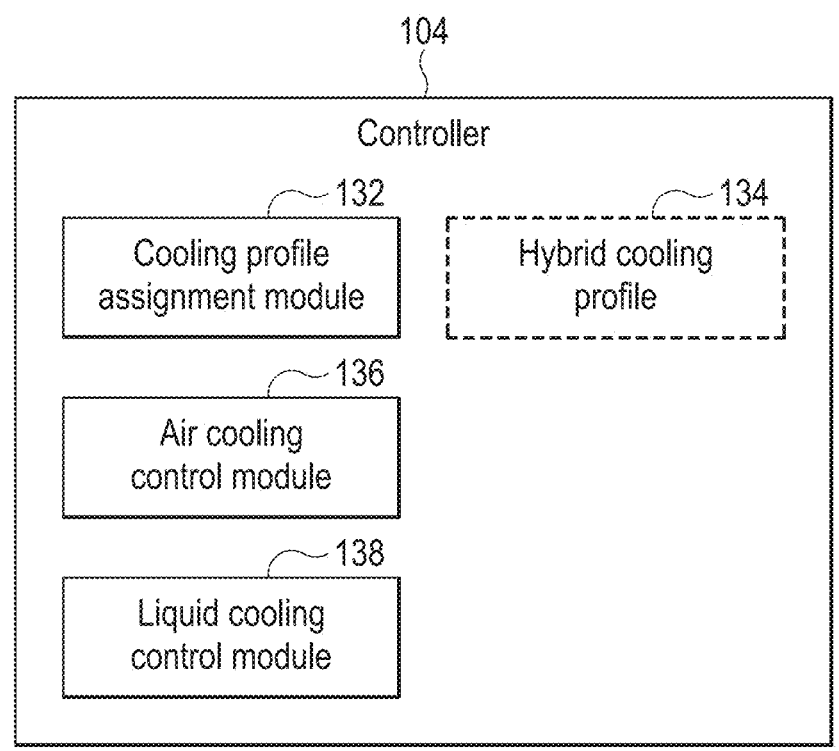
FIG. 4 is a diagram of an example controller according to the present disclosure.
Figure 5:
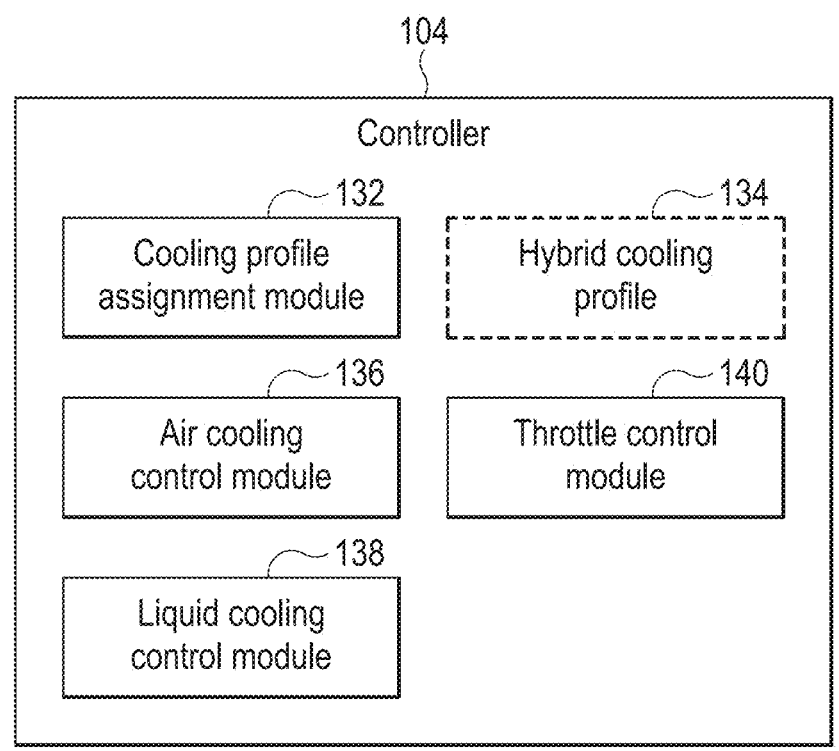
FIG. 5 is a diagram of another example controller according to the present disclosure.

FIGS. 4-5 are diagrams of example controllers 104 according to the present disclosure. For illustration, various aspects of the systems of FIGS. 1-3 are referred to with respect to the controllers of FIGS. 4-5 and several common reference numbers are used. Moreover, references to controller 104 (or related aspects or implementations) without identification of a specific figure number are understood to refer to any suitable controller (or related aspects or implementations) described herein.

In the implementation of FIG. 4, controller 104 includes a cooling profile assignment module 132 to assign a hybrid cooling profile based on temperature readings of equipment 106. The assigned hybrid cooling profile 134 can, for example, indicate that forced airflow cooling system 100 is to be used as a primary cooling system for equipment 106 unless temperature readings indicate that a heat profile of equipment 106 is above a thermal threshold. In some implementations, a heat profile can refer to a temperature of equipment 106 measured by one or more temperature sensors 102. In some implementations, assigned hybrid cooling profile 134 can indicate that liquid cooling subsystem 103 is to be used when the temperature readings indicate that a heat profile of electrical equipment 106 is above the thermal threshold. Hybrid cooling profile 134 can, for example, be selected from a set of available hybrid cooling profiles stored on memory resource 120 or can be generated based on existing conditions of system 100. Hybrid cooling profile 134 can, for example, be manually created by an administrator or other individual or group, can be automatically generated by controller 104 or another computing device, or can be determined and generated in any other suitable way.

As used herein, the term "module" refers to a combination of hardware (e.g., a processor such as an integrated circuit or other circuitry) and software (e.g., machine- or processor-executable instructions, commands, or code such as firmware, programming, or object code). A combination of hardware and software can include hardware only (i.e., a hardware element with no software elements), software hosted at hardware (e.g., software that is stored at a memory and executed or interpreted at a processor), or hardware and software hosted at hardware. It is further appreciated that the term "module" can, in some implementations, refer to one or more modules or a combination of modules. Each module of system 100 can, for example, include one or more machine-readable storage mediums and one or more computer processors.

In view of the above, it is appreciated that the various instructions of system 100 described above can correspond to separate and/or combined functional modules. For example, instructions 122 can correspond to an "air cooling subsystem module" to use air cooling subsystem 101, but not the liquid cooling subsystem 103, to cool equipment 106 when the received temperature monitoring data indicates that the electrical equipment is below the thermal criteria. It is further appreciated that a given module can be used for multiple functions. As but one example, in some implementations, a single module can be used to control the air cooling subsystem (e.g., corresponding to the instructions 122) and to control the liquid cooling subsystem (e.g., corresponding to instructions 124).

As provided above, controller 104 includes air cooling control module 136 to control forced airflow cooling system 100 for electrical equipment 106 in accordance with assigned hybrid cooling profile 134, a liquid cooling control module 138 to control liquid cooling subsystem 103 for electrical equipment 106 in accordance with assigned hybrid cooling profile 134, and a throttle control module 140 to throttle operation of electrical equipment 106 in accordance with assigned hybrid cooling profile 134. It is appreciated that aspects of the system of FIGS. 1-3 can be implemented in the controllers of FIGS. 4-5 or other implementations described herein and that aspects of other implementations described can be implemented in the controllers of FIGS. 4-5.

Figure 6:
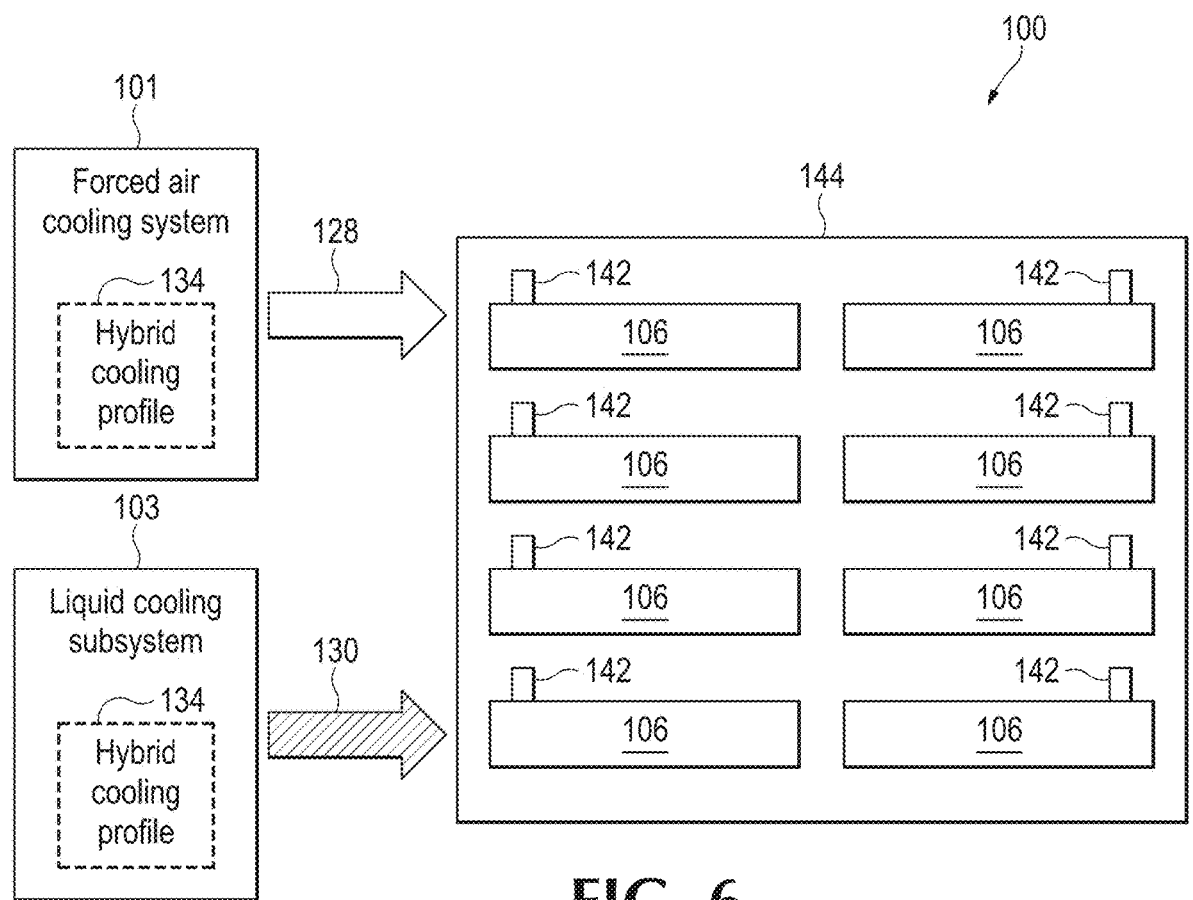
FIG. 6 is a diagram of another example system according to the present disclosure.
Figure 7:
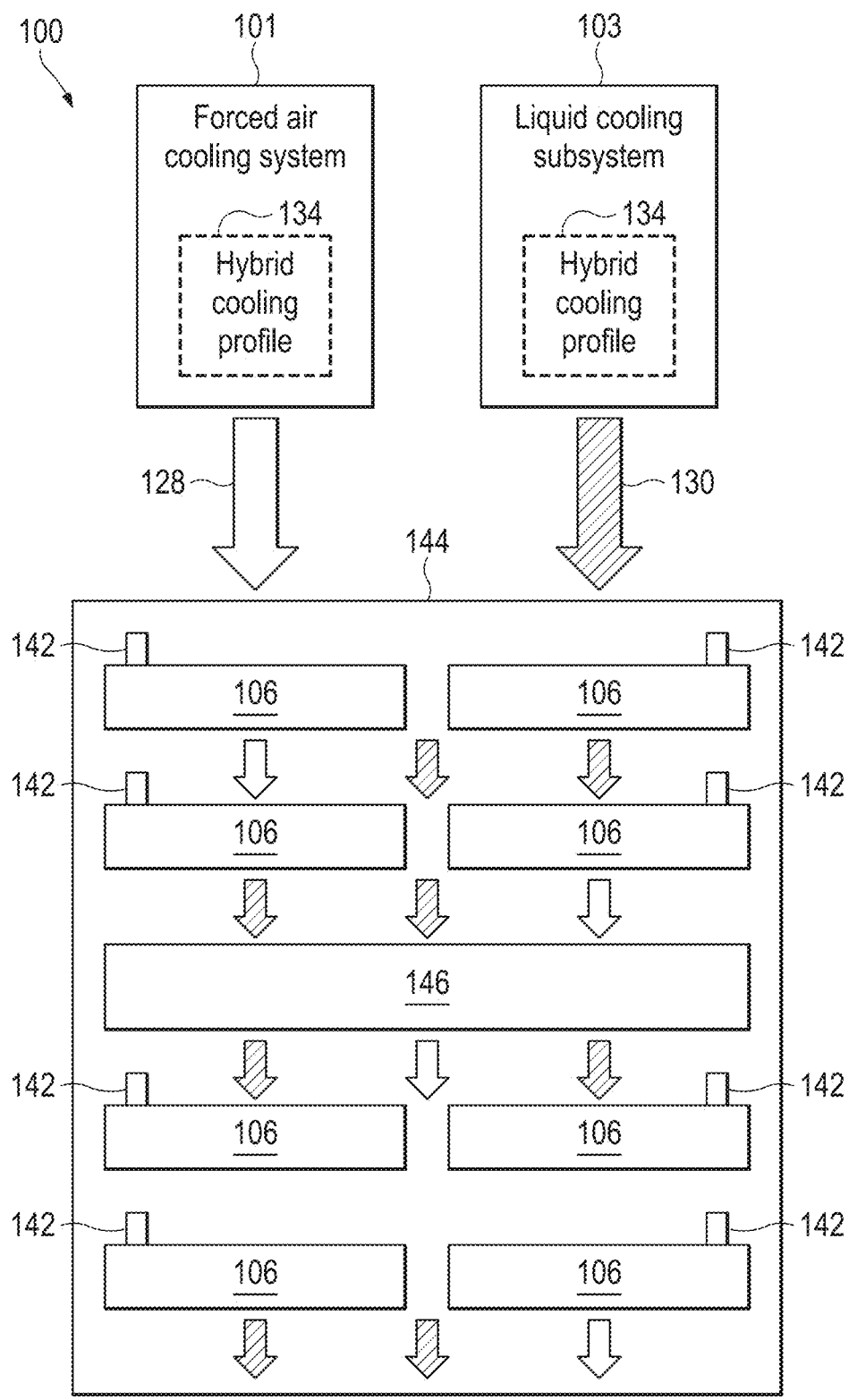
FIG. 7 is a diagram of another example system according to the present disclosure.

FIGS. 6-7 are diagrams of example systems 100 according to the present disclosure. For illustration, various aspects of the implementations of FIGS. 1-5 are referred to with respect to the system of FIGS. 6-7 and several common reference numbers are used. It is appreciated that aspects of the implementations of FIG. 1-5 can be implemented in the systems of FIGS. 6-7 or other implementations described herein and that aspects of other implementations described can be implemented in the systems of FIGS. 6-7.

Moreover, references to system 100 (or related aspects or implementations) without identification of a specific figure number are understood to refer to any suitable system (or related aspects or implementations) described herein.

In the implementation of FIG. 6, system 100 includes rack-mount electrical equipment 106. System 100 further includes heat sinks 142 thermally coupled to equipment 106 to facilitate heat removal from equipment 106 when equipment 106 is mounted in a computer rack 144. System 100 further includes a forced air cooling subsystem 101 to flow air 128 over the heat sink to remove heat from equipment 106. System 100 further includes a liquid cooling subsystem 103 to flow liquid 130 over the heat sink to remove heat from the equipment. The operation of forced air cooling subsystem 101 and liquid cooling subsystem 103 is controlled by controller 104 according to a hybrid cooling profile 134. In the implementation of FIG. 7, system 100 includes an evaporator 146 to recondition air within system 100. Each component of system 100 is described in further detail herein.

As provided above, system 100 includes rack-mount electrical equipment 106. Rack-mount electrical equipment 106 can, for example, refer to equipment designed to be installed on a suitable computer rack, such as a 19-inch width rack. In such an implementation, equipment 106 can, for example, have a front panel that is about 19 inches. It is appreciated that equipment 106 can refer to any suitable rack-mount electrical equipment, such as certain rack-mount servers, network switches, unified computing systems, cooling systems, etc.

As provided above, system 100 includes heat sinks 142 thermally coupled to equipment 106 to facilitate heat removal from equipment 106 when equipment 106 is mounted in rack 144. The term "heat sink" as used herein can, for example, refer to a passive heat exchanger that transfers heat generated by equipment 106 into a coolant fluid in motion. In some implementations, heat sink 142 can include one or more fins to facilitate heat removal. It is appreciated that other forms of passive heat exchangers can be used with system 100, such as for example, a thermosiphon to circulate a heat transfer medium to cool equipment 106.

As provided above, system 100 includes forced air cooling subsystem 101 to flow air 128 over heat sinks 142 to remove heat from equipment 106. System 100 further includes liquid cooling subsystem 103 to flow liquid 130 over heat sinks 142 to remove heat from equipment 106. The operation of forced air cooling subsystem 101 and liquid cooling subsystem 103 can, for example, be controlled by controller 104 according to hybrid cooling profile 134. Hybrid cooling profile 134 can, for example, indicate that forced air cooling subsystem 101 is to be a primary cooling system for equipment 106 when the temperature of equipment 106 is below a thermal threshold and indicates that liquid cooling subsystem 103 is to provide auxiliary cooling when the temperatures of equipment 106 are at or above the thermal threshold.

As provided above, in some implementations, system 100 includes an evaporator 146 to recondition air 128 within system 100. Evaporator 146 can, for example, be suitable for use where air 128 is at too high of a temperature to effectively cool equipment 106. In some implementations, evaporator 146 can be designed to circulate chilled water to coils or other heat exchanging structures to cool air within system 100. Such heat exchanging structures within evaporator 146 can transfer sensible heat and latent heat from the air 128 to the chilled water to cool and, in some cases, dehumidify air 128 within system 100. In some implementations, evaporator 146 can be designed to use any suitable two-phase refrigerant refrigerant as a working fluid. In some implementations, evaporator 146 can be designed to use certain refrigerants, such as R410a, R407c, and R134a.

As shown, for example, in the implementations of system 100 in FIGS. 12-15, evaporator 146 may be located at various suitable locations within system 100, such as in front of equipment 106 (relative to an air flow path), behind equipment 106, or between equipment 106. Moreover, in some implementations, multiple evaporators 146 can be provided within system 100. In some implementations, system 100 can employ additional or alternative air treatment units, such as units to condition, filter, and/or dehumidify air within system 100. It is appreciated that such units may be designed to treat air according to quality standards for use with equipment 106 within system 100.

FIGS. 8-11 are diagrams of portions of example systems 100 according to the present disclosure. For illustration, various aspects of the implementations of FIGS. 1-7 are referred to with respect to the portions of systems 100 of FIGS. 8-11 and several common reference numbers are used. It is appreciated that aspects of the implementations of FIGS. 1-7 can be implemented in the portions of systems of FIGS. 8-11 or other implementations described herein and that aspects of other implementations described can be implemented in the systems of FIGS. 8-11. Moreover, references to system 100 (or related aspects or implementations) without identification of a specific figure number are understood to refer to any suitable system (or related aspects or implementations) described herein.

Figure 8:
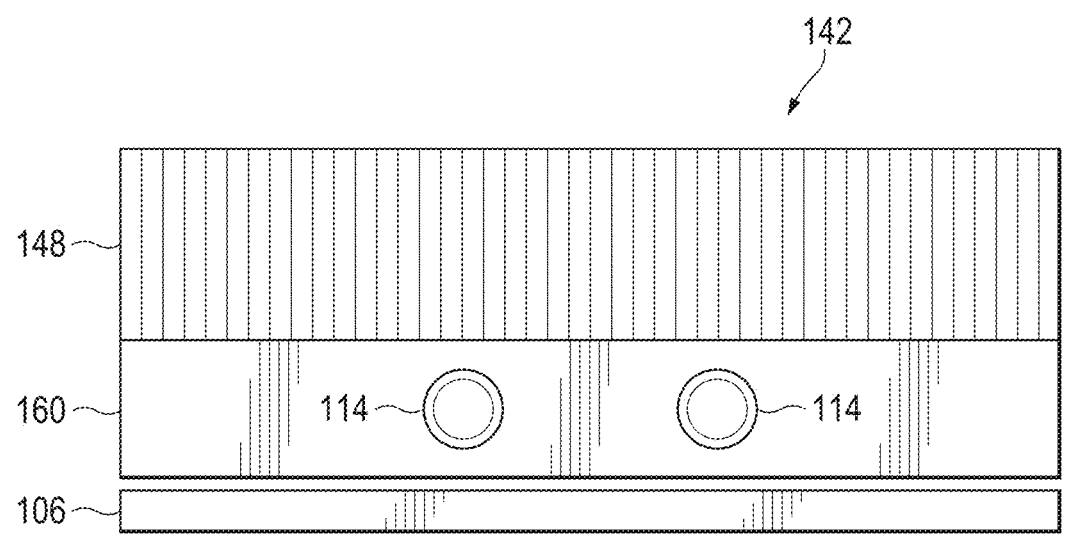
FIG. 8 is a diagram of a portion of an example system according to the present disclosure.
Figure 9:
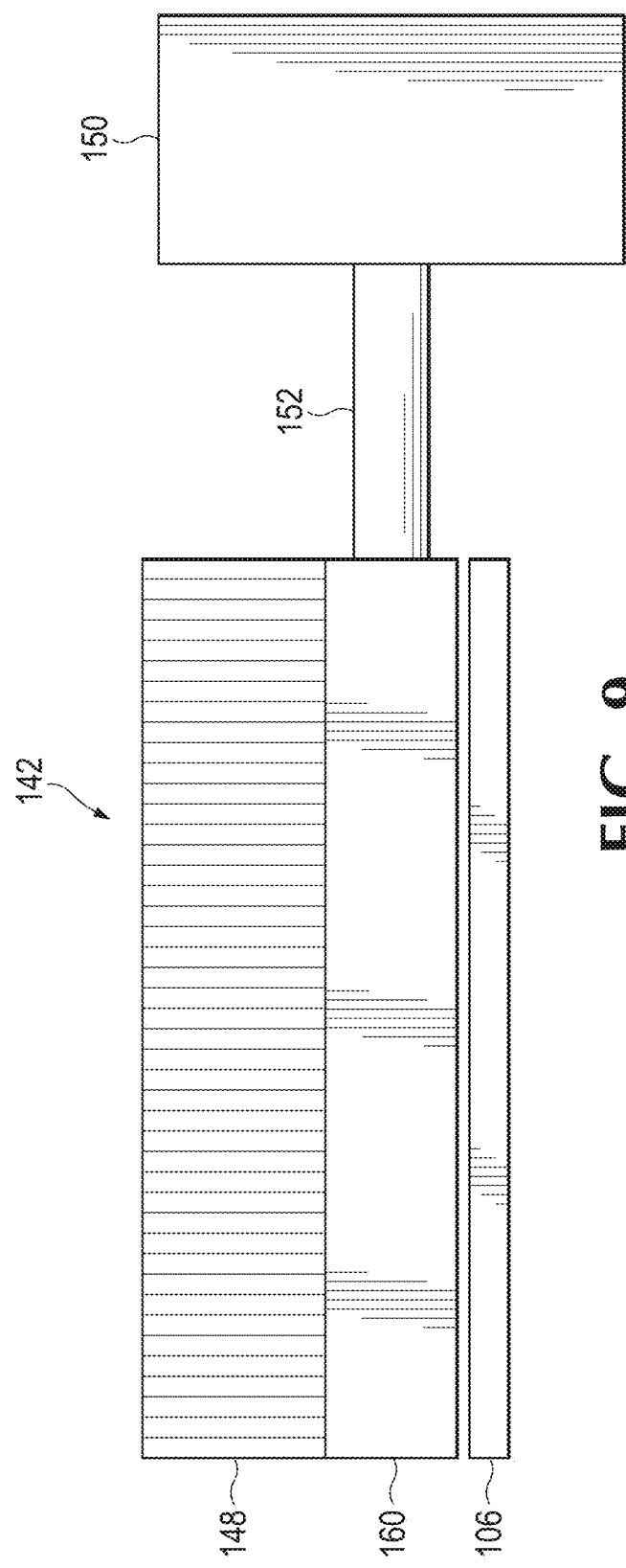
FIG. 9 is a diagram of a portion of another example system according to the present disclosure.
Figure 10:
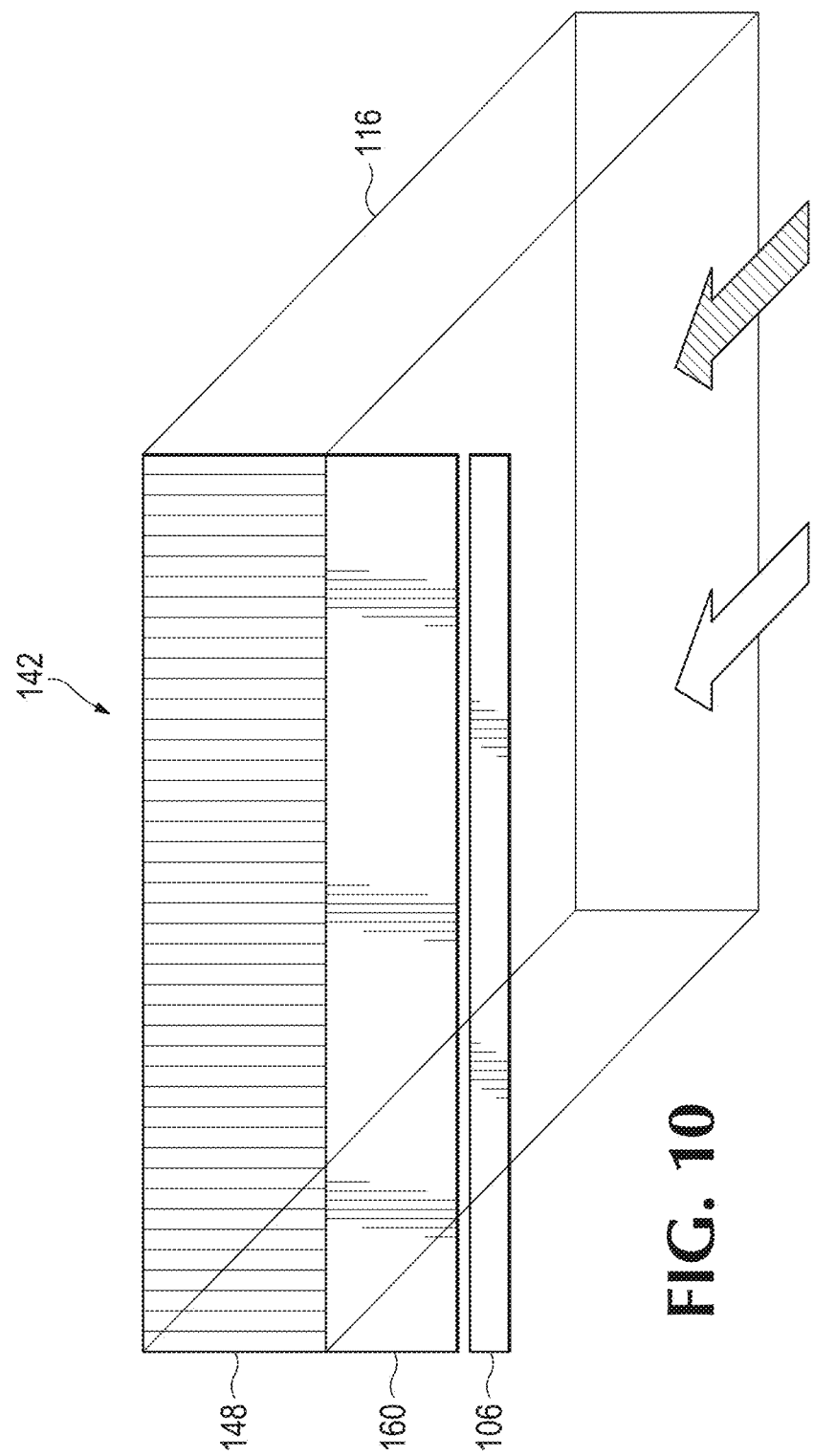
FIG. 10 is a diagram of a portion of another example system according to the present disclosure.
Figure 11:
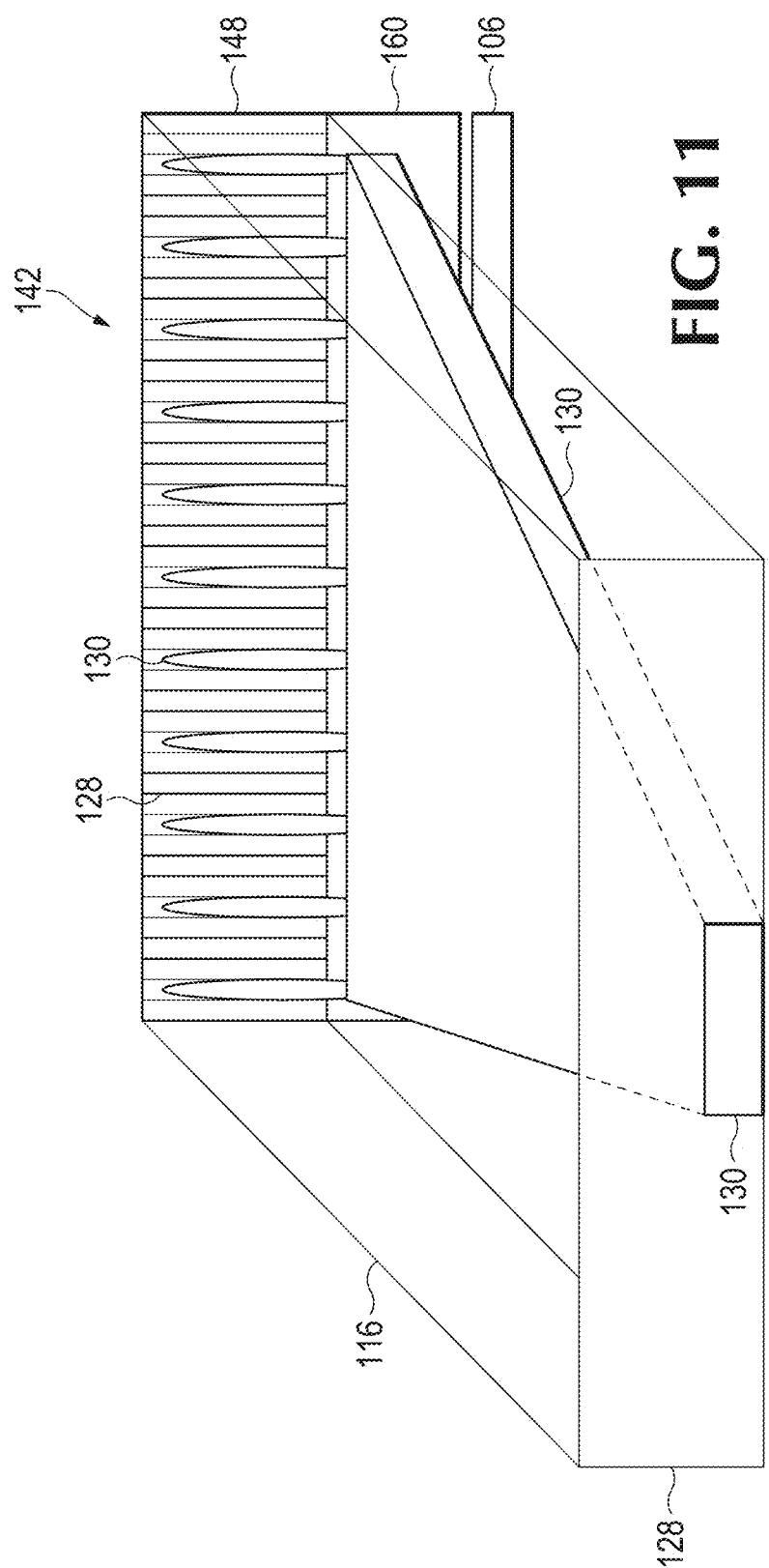
FIG. 11 is a diagram of a portion of another example system according to the present disclosure.

The portion of system 100 depicted in FIG. 8 includes a heat sink 142 and electrical equipment 106. This implementation of heat sink 142 can accept both air and water in parallel pathways. Heat sink 142 can, for example, rely on fins 148 and directional air flow for cooling of equipment 106. Heat sink 142 can further include fluid channels 114 integrated into a lower portion 160 of heat sink 142 to allow liquid to pass through the heat sink 142 to cool equipment 106. In this implementation, both air and water cooling can be performed at the same time. The portion of system 100 depicted in FIG. 9 includes a heat sink 142, a reservoir 150, a heat pipe 152, and electrical equipment 106. Similar to the implementation of FIG. 8, the portion of system 100 depicted in FIG. 9 also has fins and uses directional air flow for cooling. In addition, in this implementation, heat is also channeled to a side of a tray of system 100 to use a liquid cooling system including a heat pipe 152 and a reservoir 150. In this implementation, both air and liquid cooling can be performed at the same time. The portion of system 100 depicted in FIG. 10 includes a heat sink 142 that accepts both air and liquid in the same channel 116, which can be considered to be a serial pathway. This implementation includes fins 148 for directional air flow for cooling. In addition, the air flow channel is isolated and closed from the rest of air cooling subsystem 101. When the heat measured by equipment 106 hits the thermal threshold, channel 116 can switch from air cooling to liquid cooling, and liquid 130, rather than air 128, can be passed through fins 148 of heat sink 142. The portion of system 100 depicted in FIG. 11 can allow, in an air cooling mode, for heat from a heat source to conduct to fins 148 and to then be convected away by air 128. In a liquid cooling mode, heat from air 128 can be conducted into a colder fin 148, which can, for example, be colder because its heat was conducted into liquid 130 passing through a base of fins 148. In such an implementation, fins 148 may act as an evaporator 146. It is appreciated that in some implementations, channel 116 is not an air- or liquid-tight ductwork. Moreover it is appreciated that channel 116 may be implemented such that it does not switch between a volume flow rate of liquid 130 and a volume flow rate of air 128 to cool fins 148. In some implementation, channel 116 can be in the form of a plastic (or other suitable material) baffle ductwork designed to flow air 128 and can also carry a liquid pipe that goes into a heatsink (e.g., heat sink 142).

FIGS. 12-15 are diagrams of portions of example systems 100 according to the present disclosure. For illustration, various aspects of the implementations of FIGS. 1-11 are referred to with respect to the portions of systems 100 of FIGS. 12-15 and several common reference numbers are used. It is appreciated that aspects of the implementations of FIGS. 1-11 can be implemented in the portions of systems of FIGS. 12-15 or other implementations described herein and that aspects of other implementations described can be implemented in the systems of FIGS. 12-15. Moreover, references to system 100 (or related aspects or implementations) without identification of a specific figure number are understood to refer to any suitable system (or related aspects or implementations) described herein.

Figure 12:
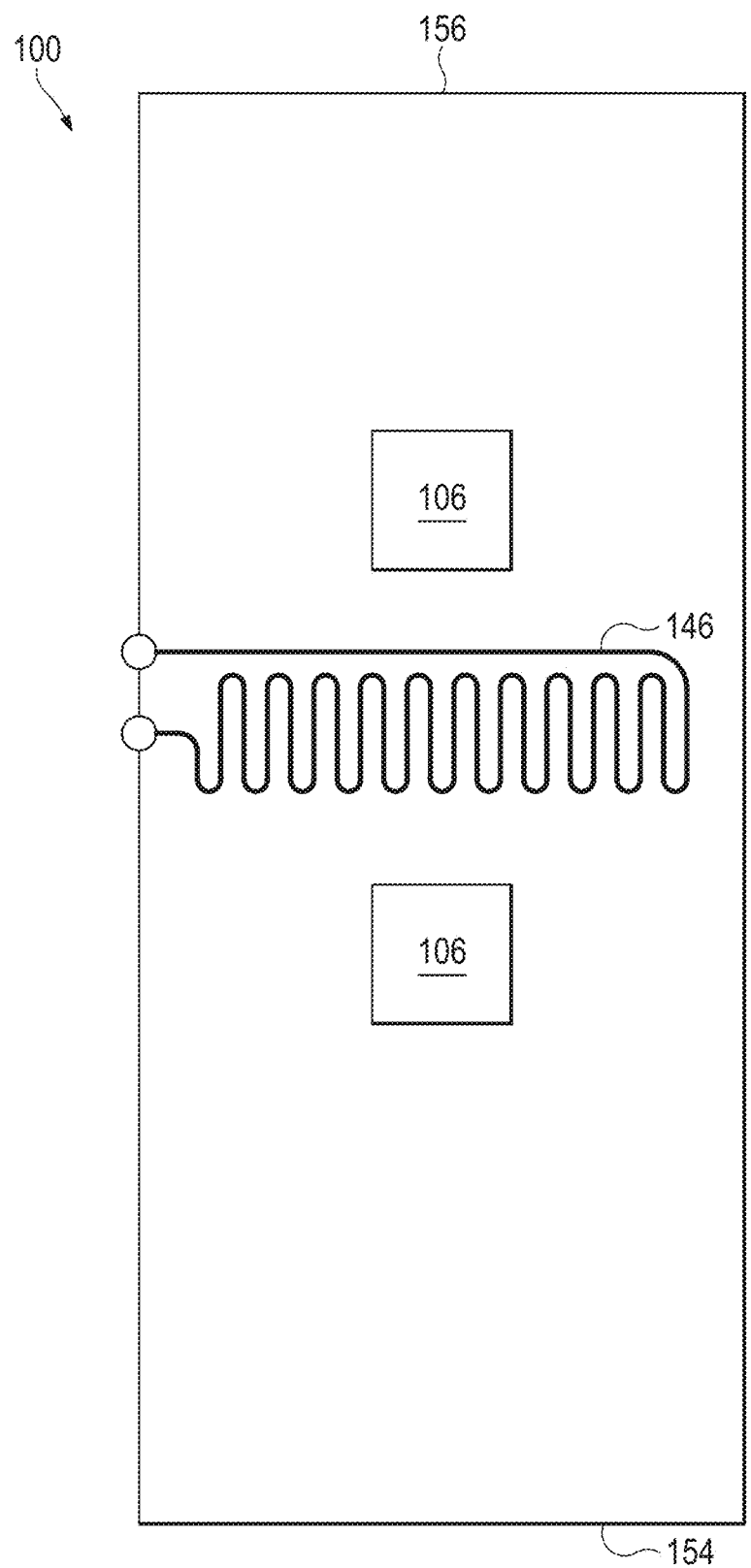
FIG. 12 is a diagram of another example system according to the present disclosure.
Figure 13:
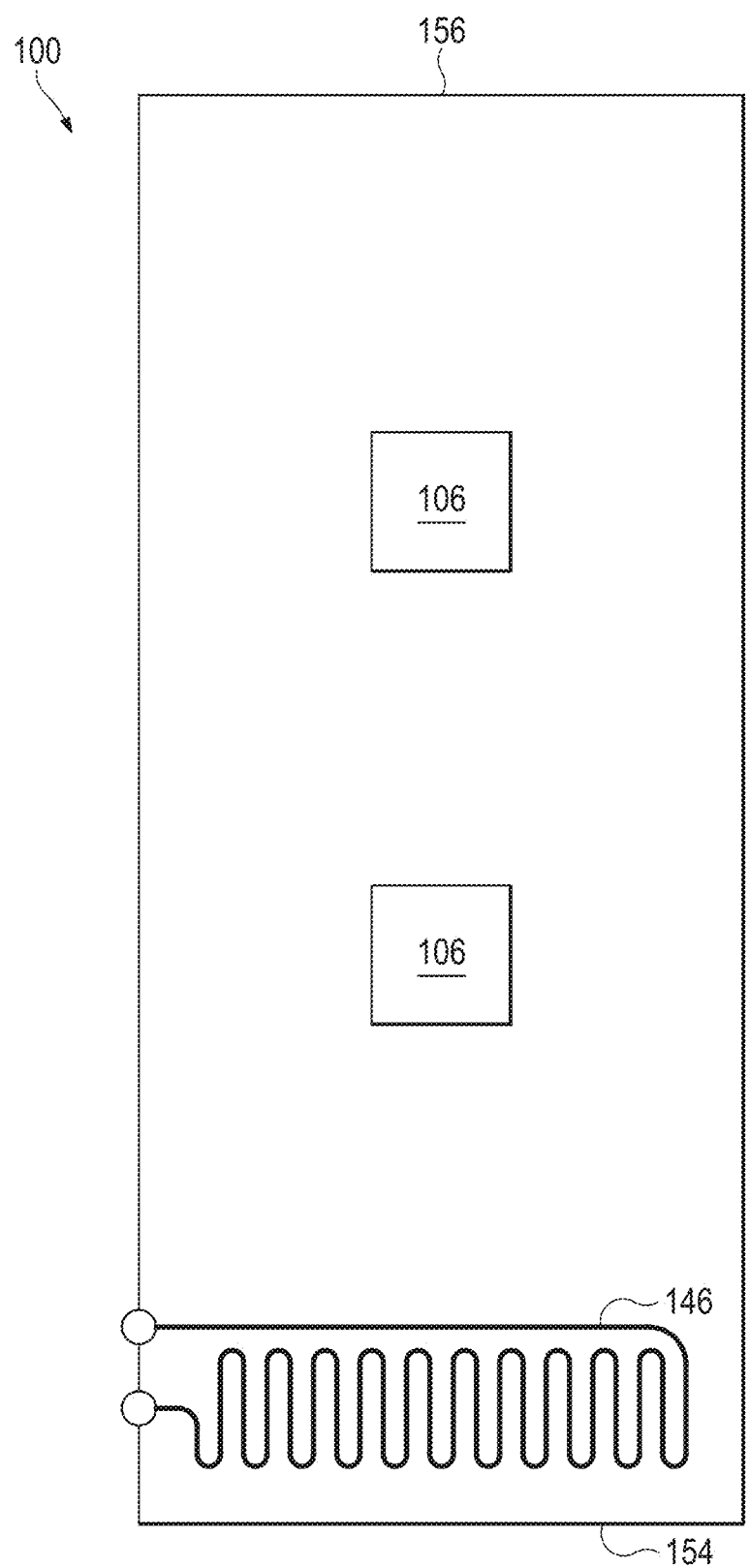
FIG. 13 is a diagram of another example system according to the present disclosure.
Figure 14:
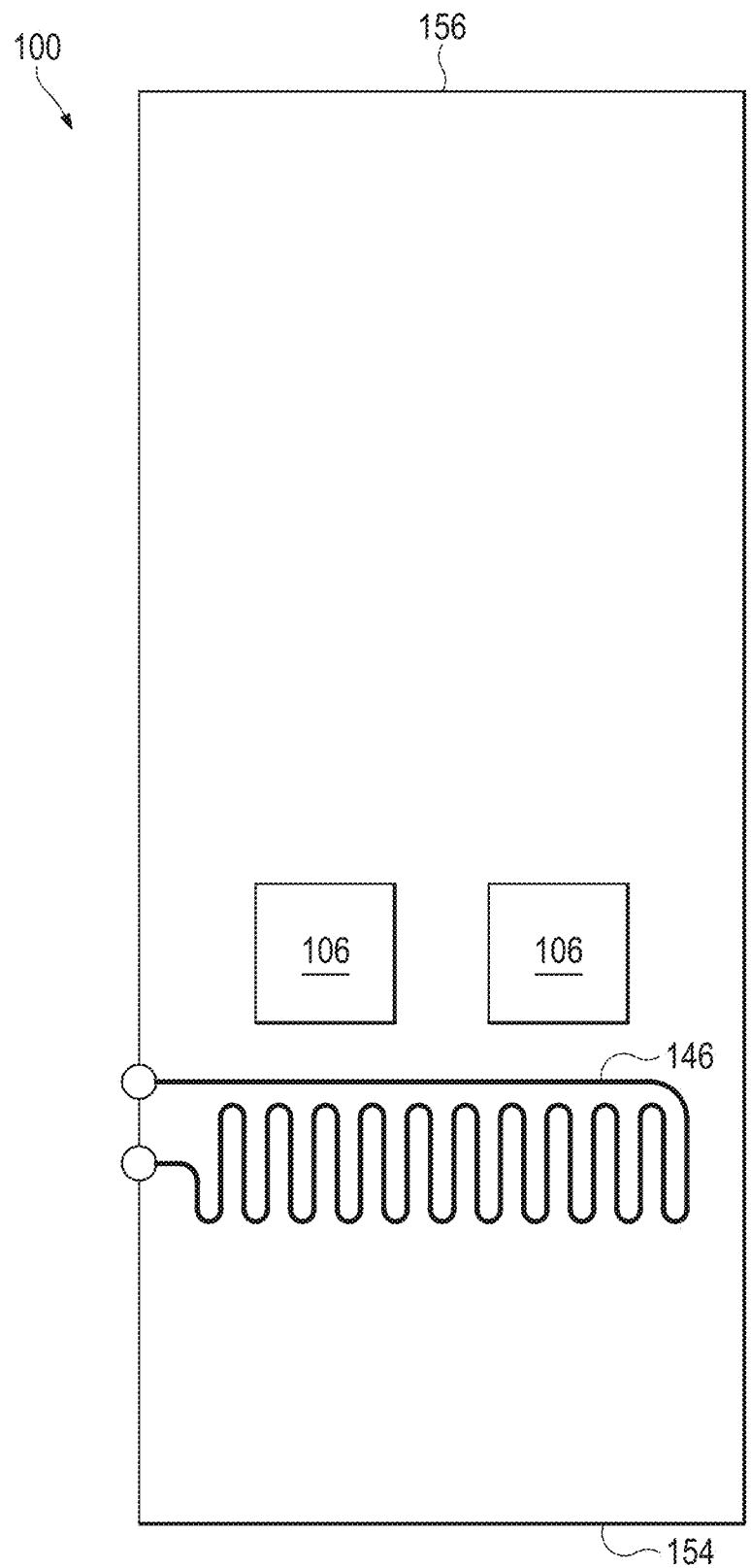
FIG. 14 is a diagram of another example system according to the present disclosure.
Figure 15:
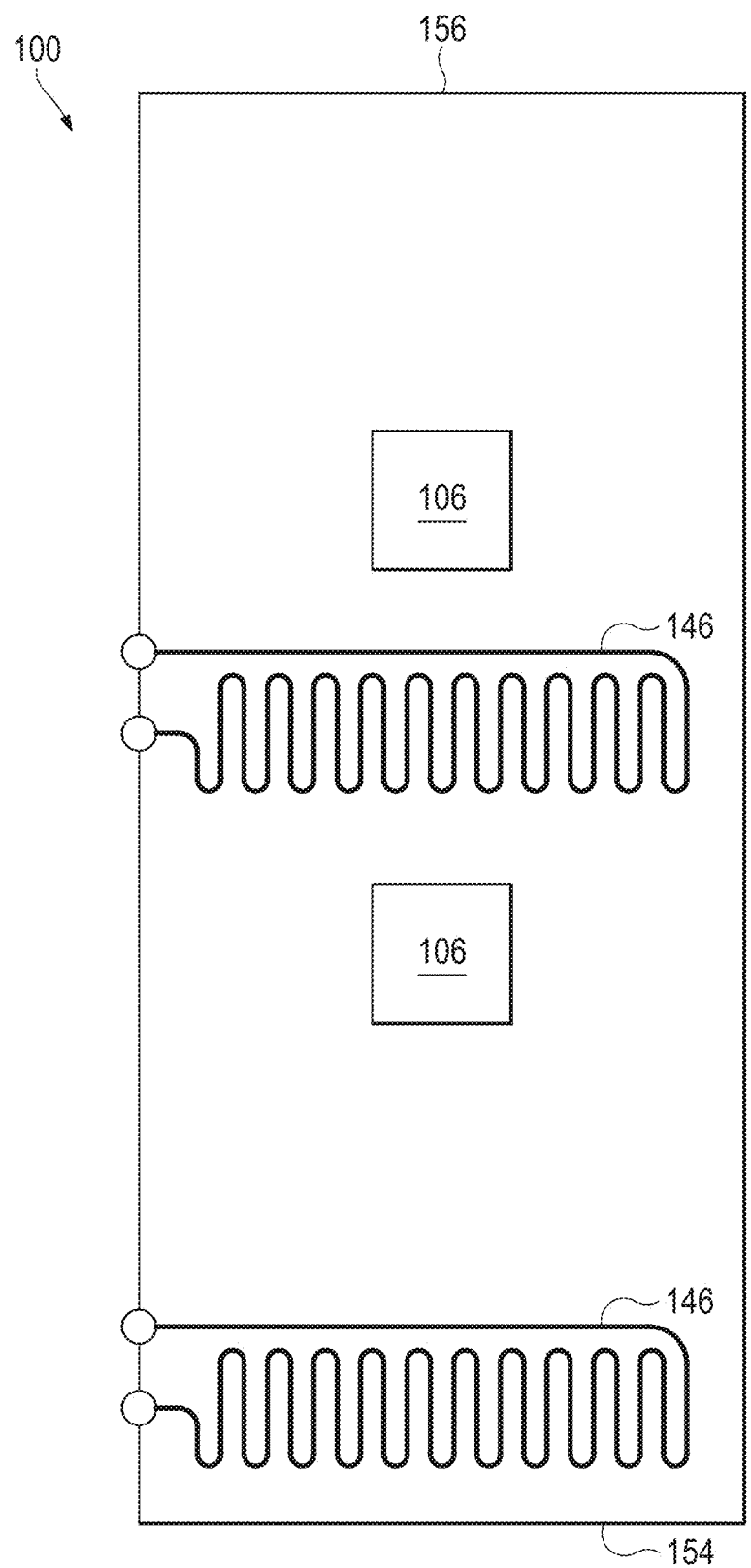
FIG. 15 is a diagram of another example system according to the present disclosure.

In the implementation of system 100 depicted in FIG. 12, system 100 includes a front end 154, a rear end 156, a first equipment 106, and a second equipment 106, with an evaporator 146 positioned between first equipment 106 and second equipment 106. In this implementation, air flows from front end 154 of system 100 to rear end 156 of system 100, thereby passing over first equipment 106, evaporator 146, and second equipment 106, which allows evaporator 146 to cool air leaving first equipment 106 before it is passed over second equipment 106. In the implementation of system 100 depicted in FIG. 13, evaporator 146 is positioned upstream of both first equipment and second equipment. In the implementation of system 100 depicted in FIG. 14, first equipment 106 and second equipment 106 are positioned laterally adjacent to each other such that air leaving evaporator 146 (at a certain temperature and condition) is passed over first equipment 106 and second equipment 106 at the same time (or in parallel). In the implementation of system 100 depicted in FIG. 15, multiple evaporators 146 are used to cool equipment 106. In this implementation, a first evaporator 146 is provided at front end 154 of system 100, and a second evaporator 146 is provided between first equipment 106 and second equipment 106.

FIGS. 16a-b and FIGS. 17a-c each depict an example method 158 for operation of system 100 according to the present disclosure. For illustration, various aspects of the implementations of FIGS. 1-15 are referred to with respect to the methods 158 of FIGS. 16a-b and FIGS. 17a-c and several common reference numbers are used. It is appreciated that aspects of the implementations of FIG. 1-15 can be implemented in the methods 158 of FIGS. 16a-b and FIGS. 17a-c or other implementations described herein and that aspects of other implementations described can be implemented in methods 158. Moreover, references to system 100 (or related aspects or implementations) without identification of a specific figure number are understood to refer to any suitable system (or related aspects or implementations) described herein.

Figure 16A:
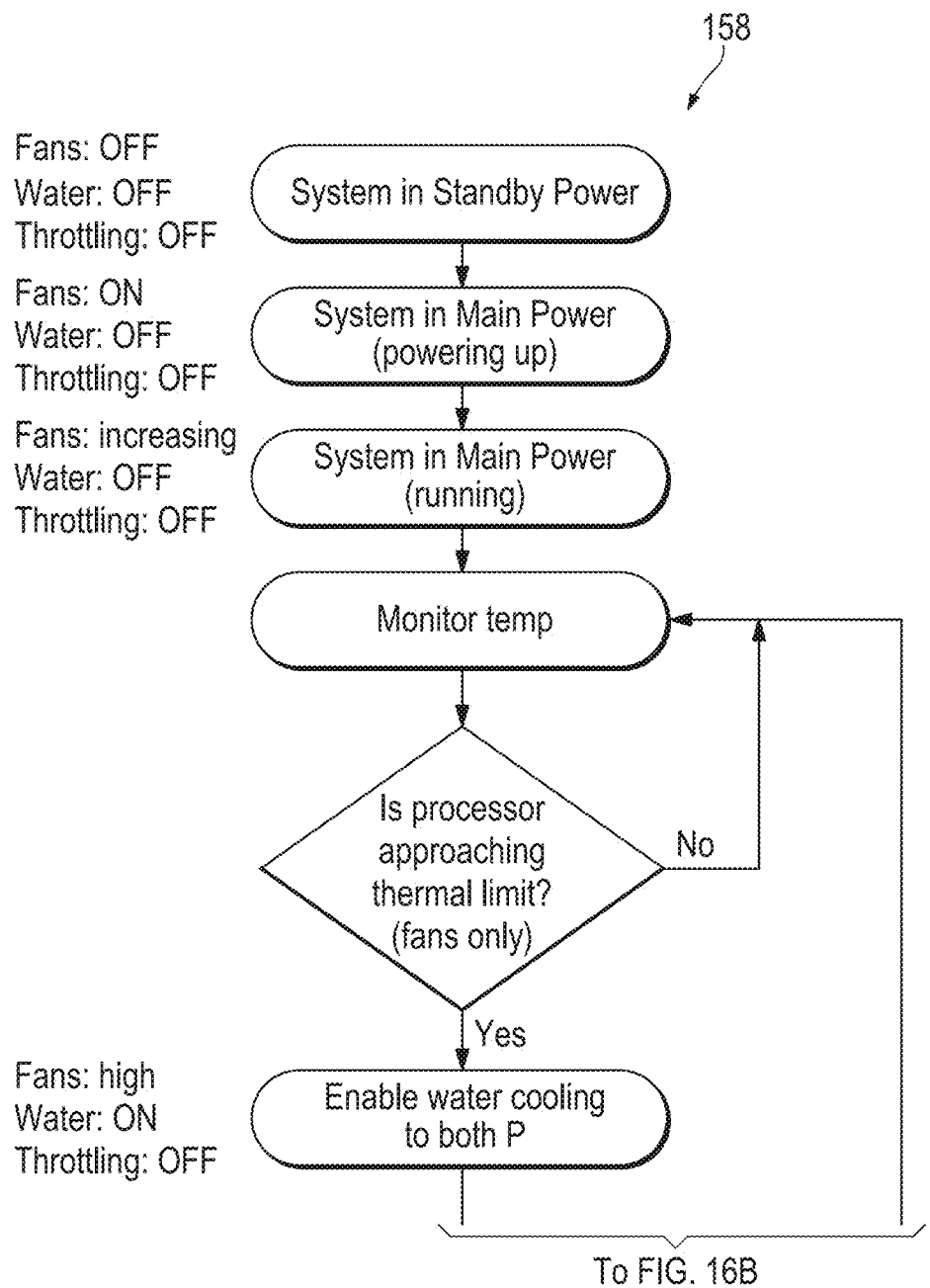
FIGS. 16a-b together form a flowchart for an example method according to the present disclosure.
Figure 16B:
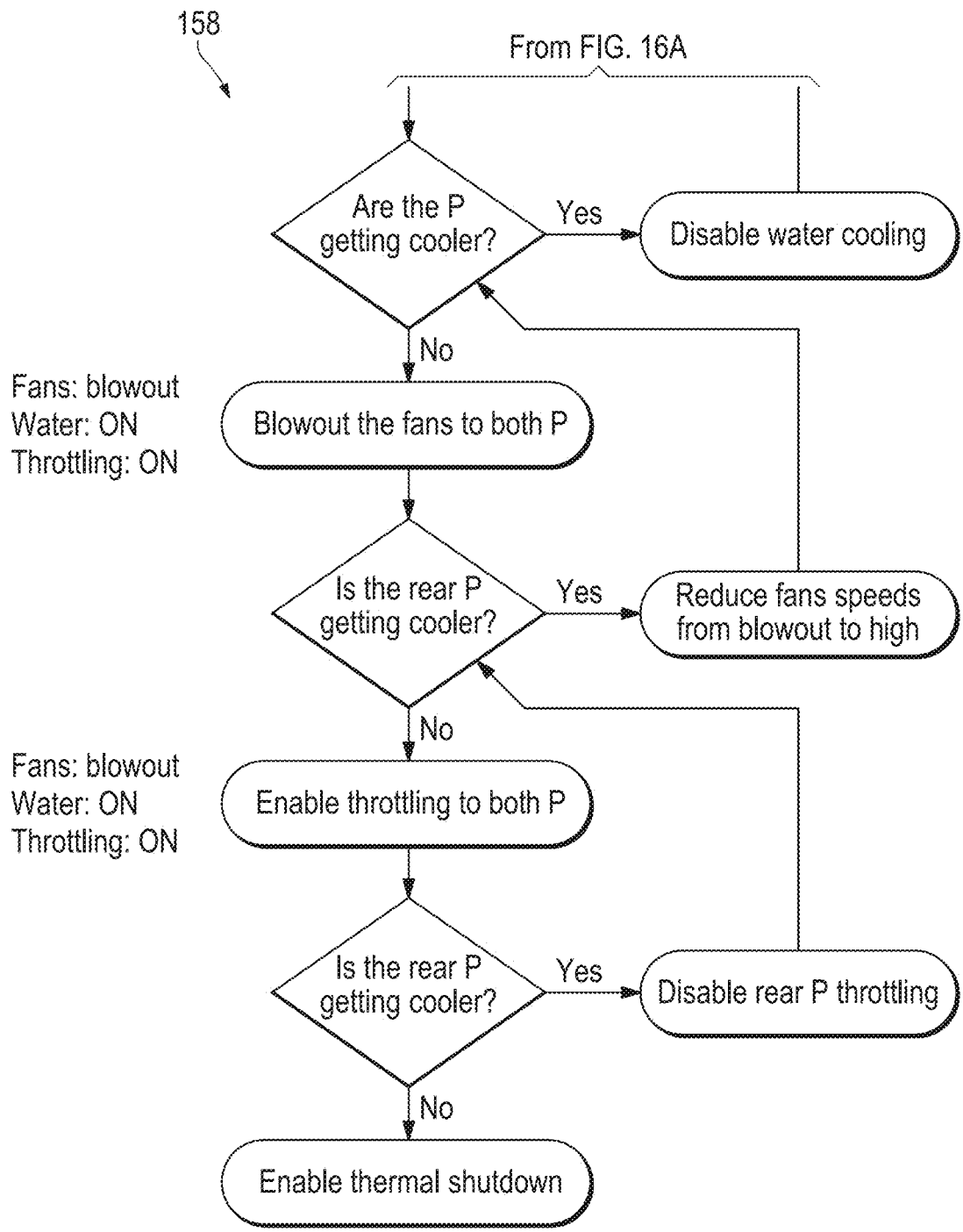
Figure 17B:
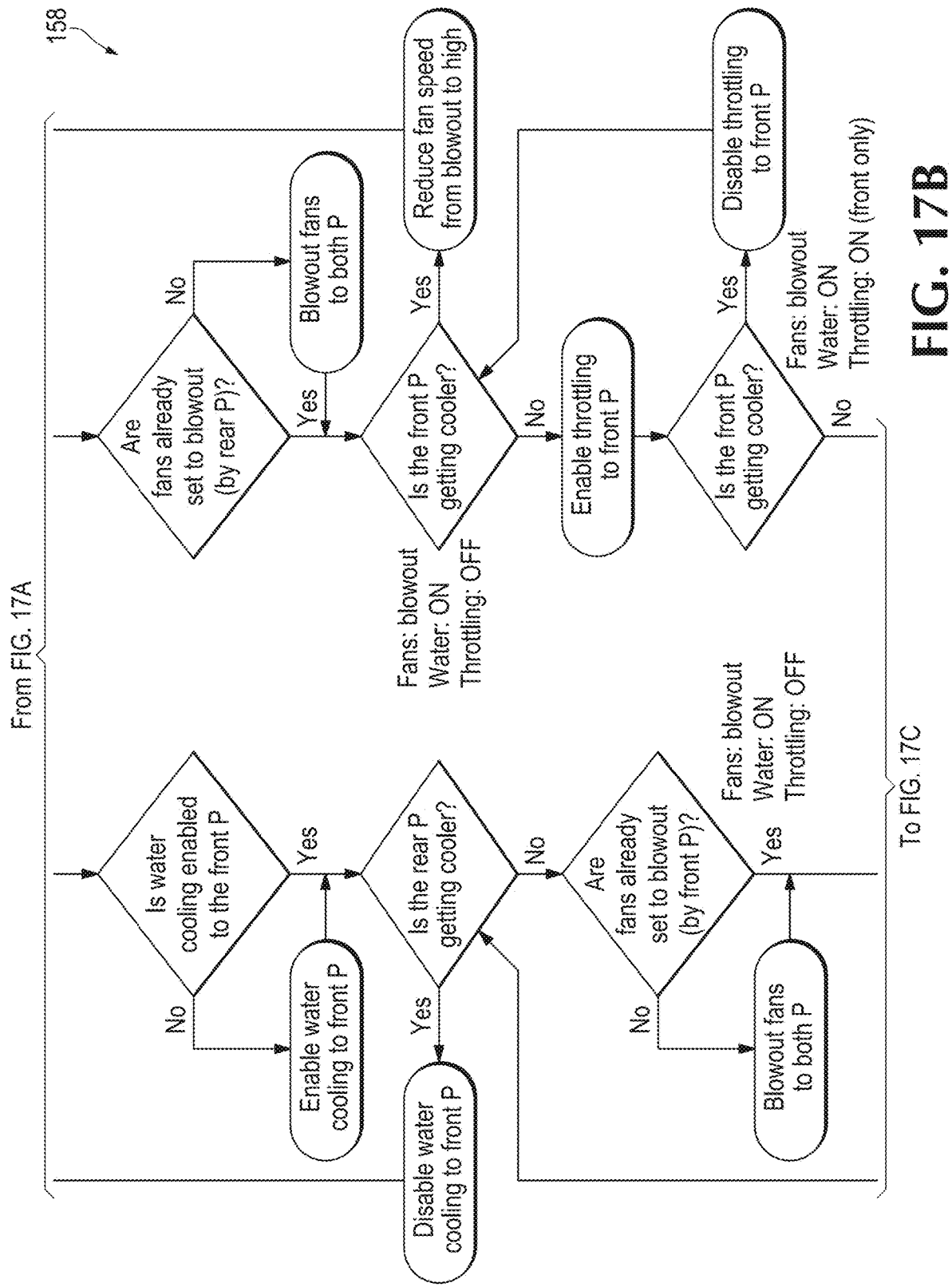
Figure 17C:
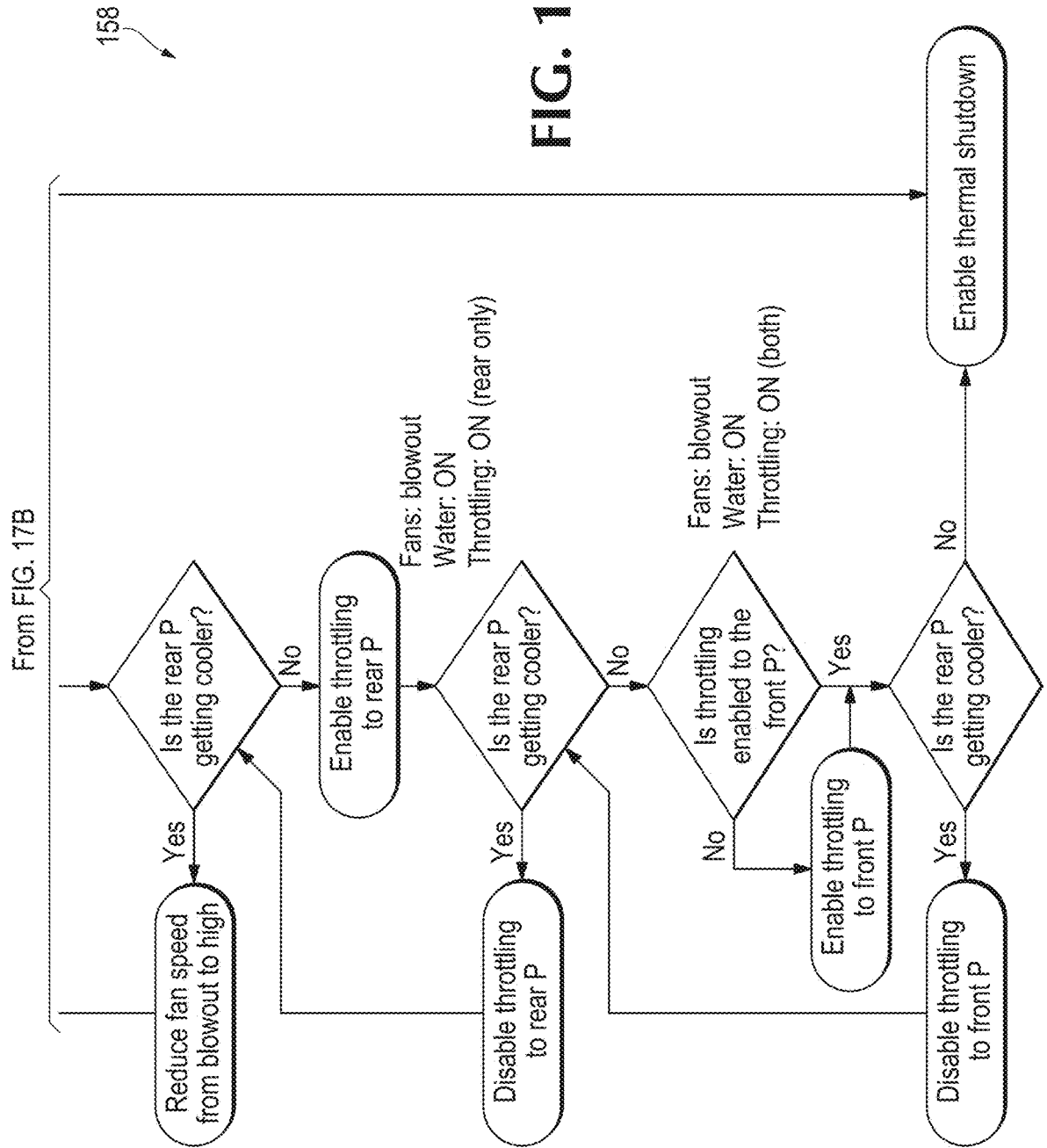

In the implementation of method 158 in FIGS. 16a-b, controller 104 monitors thermal data for equipment 106 and adjusts operation of air cooling subsystem 101, liquid cooling subsystem 103, and throttling in order to achieve certain thermal properties to stay below a thermal threshold. In the implementation of method 158 in FIG. 17, controller 104 monitors multiple sets of thermal data of equipment 106 (or groups of equipment 106) and can separately adjust operation of air cooling subsystem 101, liquid cooling subsystem 103, and throttling in order to achieve certain thermal properties to stay below a thermal threshold.

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be understood that the systems, apparatuses, and methods described herein can include various combinations and/or sub-combinations of the components and/or features of the different implementations described. Thus, features described with reference to one or more implementations can be combined with other implementations described herein.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
   a temperature sensor to monitor a temperature of electrical equipment;
   a controller communicatively coupled to the temperature sensor to receive temperature monitoring data from the temperature sensor;
   an air cooling subsystem controlled by the controller to cool the electrical equipment using forced airflow; and
   a liquid cooling subsystem controlled by the controller to cool the electrical equipment using forced liquid flow;
   wherein the controller includes
      a processing resource, and
      a memory resource storing machine readable instructions to cause the processing resource to control the air cooling subsystem and the liquid cooling subsystem based on temperature monitoring data received from the temperature sensor, wherein the instructions include:
         instructions to use the air cooling subsystem, but not the liquid cooling subsystem, to cool the electrical equipment when the received temperature monitoring data indicates that the electrical equipment is below a thermal criteria,
         instructions to use at least the liquid cooling subsystem to cool the electrical equipment when the received temperature monitoring data indicates that the electrical equipment is at or above the thermal criteria;
         instructions to select a hybrid cooling profile from a set of available hybrid cooling profiles; and
         instructions to throttle operation of the electrical equipment in accordance with the selected hybrid cooling profile.

2. The system of claim 1, wherein the controller is to determine that the received temperature monitoring data indicates that the electrical equipment is below the thermal criteria when the monitored temperature of the electrical equipment is below a predetermined temperature value.

3. The system of claim 1, wherein the controller is to determine that the received temperature monitoring data indicates that the electrical equipment is below the thermal criteria when an average monitored temperature of the electrical equipment for a period of time is below a predetermined temperature value.

4. The system of claim 1, wherein the air cooling subsystem includes a fan to cool the electrical equipment.

5. The system of claim 1, wherein the liquid cooling subsystem uses a pump to circulate liquid to cool the electrical equipment.

6. The system of claim 1, further comprising:
   an air cooling channel through which air is passed to cool the electrical equipment; and
   a liquid cooling channel through which liquid is passed to cool the electrical equipment.

7. The system of claim 6, wherein the air cooling channel is a distinct channel from the liquid cooling channel.

8. The system of claim 6, wherein the air cooling channel is in the form of ductwork and the liquid cooling channel is in the form of a pipe, and wherein the liquid cooling channel is disposed within an interior of the air cooling channel.

9. The system of claim 1, further comprising:
   electrical equipment to be cooled by the air cooling subsystem and the liquid cooling subsystem.

10. A controller comprising:
    a cooling profile assignment module to assign a hybrid cooling profile from a set of available hybrid cooling profiles based on temperature readings of electrical equipment,
    an air cooling control module to control a forced airflow cooling system for the electrical equipment in accordance with the assigned hybrid cooling profile;
    a liquid cooling control module to control a liquid cooling system for the electrical equipment in accordance with the assigned hybrid cooling profile,
    wherein the assigned hybrid cooling profile indicates that the forced airflow cooling system is to be used as a primary cooling system for the electrical equipment unless temperature readings indicate that a heat profile of the electrical equipment is above a thermal threshold; and
    a throttle control module to throttle operation of the electrical equipment in accordance with the assigned hybrid cooling profile.

11. The controller of claim 10, wherein the assigned hybrid cooling profile indicates that the liquid cooling system is to be used when the temperature readings indicate that a heat profile of the electrical equipment is above the thermal threshold.

12. A system comprising:

rack-mount electrical equipment;

heat sinks thermally coupled to the equipment to facilitate heat removal from the equipment when the equipment is mounted in a rack;

a forced air cooling system to flow air over the heat sinks to remove heat from the equipment when the equipment is mounted in the rack, wherein the operation of the forced air cooling system is controlled by the controller according to a hybrid cooling profile which is selected from a set of available hybrid cooling profiles; and a liquid cooling system to flow liquid over the heat sinks to remove heat from the equipment when the equipment is mounted in the rack, wherein the operation of the liquid cooling system is controlled by the controller according to the selected hybrid cooling profile, wherein the selected hybrid cooling profile indicates that the forced air cooling system is to be a primary cooling system for the equipment when the temperature of the equipment is below a thermal threshold and indicates that the liquid cooling system is to provide auxiliary cooling when the temperatures of the equipment are at or above the thermal threshold, and wherein the selected hybrid cooling profile further indicates that operation of the electrical equipment is to be throttled.

13. The system of claim 12, further comprising:

an evaporator to recondition air within the housing.

14. The system of claim 13, wherein the evaporator is along an air flow path between adjacent rack-mounted equipment of a plurality of servers.

* * * * *